US005529682A

United States Patent [19]
Knapp et al.

[11] Patent Number: 5,529,682
[45] Date of Patent: Jun. 25, 1996

[54] METHOD FOR MAKING SEMICONDUCTOR DEVICES HAVING ELECTROPLATED LEADS

[75] Inventors: James H. Knapp, Chandler; Francis J. Carney, Jr., Gilbert, both of Ariz.

[73] Assignee: Motorola, Inc., Schaumburg, Ill.

[21] Appl. No.: 494,482

[22] Filed: Jun. 26, 1995

[51] Int. Cl.⁶ .................................................. C25D 5/50
[52] U.S. Cl. .......................... 205/227; 205/225; 205/123
[58] Field of Search ................................. 205/225, 226, 205/227, 228, 123; 437/923

[56] References Cited

U.S. PATENT DOCUMENTS

| | | | |
|---|---|---|---|
| 4,012,832 | 3/1977 | Crane | 437/923 |
| 4,894,752 | 1/1990 | Murata et al. | 361/421 |
| 5,167,794 | 12/1992 | Ito | 205/228 |

*Primary Examiner*—John Niebling
*Assistant Examiner*—Kishor Mayekar
*Attorney, Agent, or Firm*—Kevin B. Jackson

[57] ABSTRACT

A method for use with semiconductor devices (47) that have leads (49) electroplated with a solderable metal (53) includes exposing the solderable metal (53) to an elevated temperature sufficient to flow or melt the solderable metal (53). In a preferred embodiment, the solderable metal (53) is exposed to the elevated temperature before the leads (49) are severed from the leadframe (48).

14 Claims, 2 Drawing Sheets

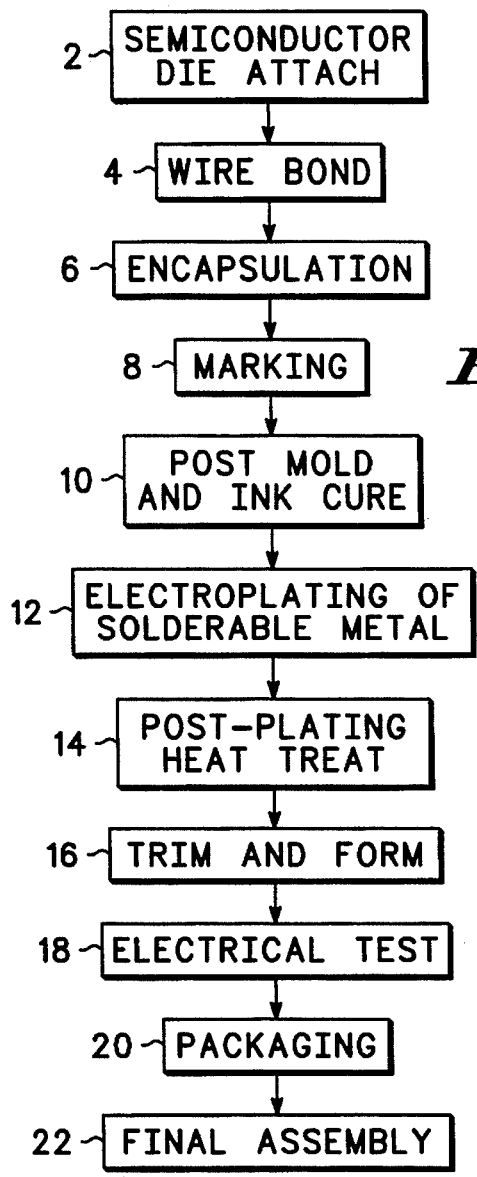
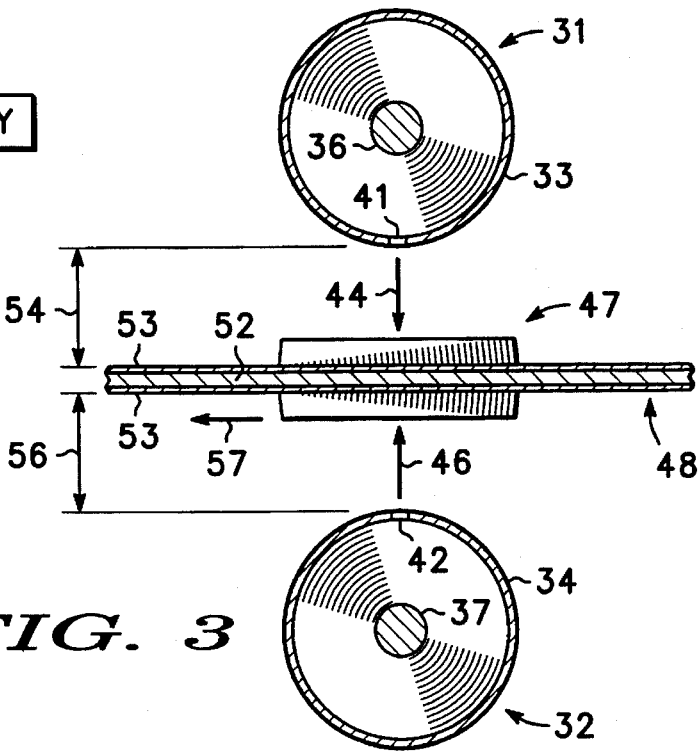
FIG. 1
FIG. 3

METHOD FOR MAKING SEMICONDUCTOR DEVICES HAVING ELECTROPLATED LEADS

BACKGROUND OF THE INVENTION

This invention relates, in general, to semiconductor devices, and more particularly, to methods for making semiconductor devices having electroplated leads.

Semiconductor packaged devices such as quad flat pack (QFP) devices typically comprise a semiconductor die bonded to a metal leadframe, which includes a die bond pad and a plurality of leads. Thin wires, typically referred to as wire bonds, connect bond pads on the semiconductor die to the appropriate leads. An encapsulent covers the semiconductor die, the wire bonds, and a portion of the leads. Exposed portions of the leads are often coated with a low temperature solderable metal, such as tin/lead (Sn/Pb), to enhance wetting or solderability and to form the metallurgical connection when the packaged device is connected to a printed circuit board during final assembly.

Typically, manufacturers coat the exposed leads using either a solder-dip process or an electroplating process. In a solder-dip process, the exposed leads are immersed in molten solder thereby covering the exposed leads. One disadvantage of the solder-dip process is that excess solder accumulates on the exposed leads, which causes solder bridging and ultimately electrical shorts. Because of the solder bridging, solder dipping is not suitable for devices having a small pitch between adjacent leads.

In an electroplating process, the leads are covered with a solderable metal by exposing them to an electrolytic solution, an anode comprised of the solderable metal, and a current source. Electroplating is preferred over solder-dipping in packages that have a small pitch between adjacent leads because electroplating provides a more uniform coverage. However, several problems exist with electroplated leads formed using conventional electroplating techniques.

For example, the electroplated solderable metal often exhibits poor adhesion to the underlying leads. This poor adhesion in turn causes the electroplated solderable metal to delaminate or peel from the underlying leads, particularly during subsequent processing (e.g., trim and form, electrical testing, tape and reel, etc.). The delaminated solderable metal detrimentally impacts equipment up-time (e.g., delaminated metal clogs or obstructs equipment), equipment life, electrical yields (e.g., electrical shorts resulting from delaminated metal bridging adjacent leads), and reliability. Equipment down-time decreases throughput thereby increasing manufacturing costs. In addition, the delamination problem requires manufacturers to use visual inspections at various stages after electroplating to control problem parts, which greatly adds to manufacturing costs. Furthermore, localized thick areas or nodules of solderable metal form during electroplating, which can result in bridging between adjacent leads and ultimately electrical shorting problems.

As is readily apparent, it would be advantageous to have methods that overcome at least the above problems associated with leads having electroplated solderable metal. It would be of further advantage to do so in a cost effective manner.

BRIEF DESCRIPTION OF THE DRAWINGS

FIG. 1 illustrates a flow diagram of a method according to the present invention;

FIG. 3 illustrates an enlarged cross-sectional view of the apparatus of FIG. 2 taken along reference line 3—3.

DETAILED DESCRIPTION OF THE DRAWINGS

Figure 2:
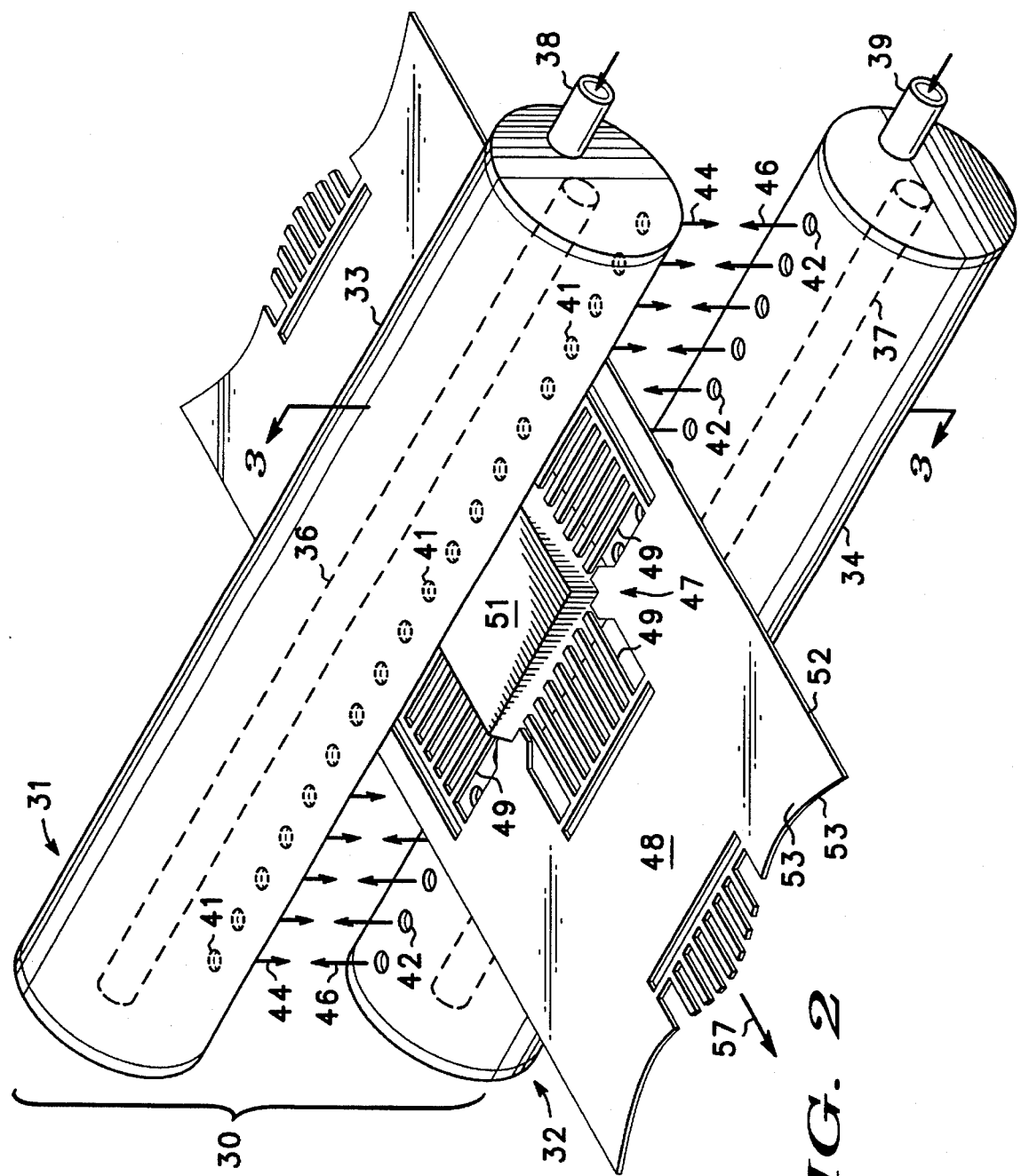
FIG. 2 illustrates an isometric view of a preferred apparatus for use with the present invention.

In general, the present invention provides a method for improving the adhesion of solderable metal electroplated onto the leads of an electronic device and for improving the reliability of the electronic device. In particular, the present invention provides a method for heating electronic device leads electroplated with a solderable metal following the electroplating process at a temperature sufficient to flow or melt the solderable metal. The heating is done prior to soldering or attaching the electroplated leads of the electronic device to a next level of assembly (e.g., an application or printed circuit type board, a support substrate, etc.). The present invention can be better understood by referring to FIGS. 1–3 together with the following detailed description. The same reference numbers are used where appropriate for ease of understanding.

FIG. 1 is a flow diagram representing a preferred process sequence for improving the adhesion of an electroplated solderable metal to semiconductor device leads and for improving the reliability of the semiconductor device. FIG. 1 represents a preferred sequence for forming a semiconductor device having at least one metal lead electroplated with a solderable metal. Typically, several semiconductor devices are processed together in a multiple unit leadframe strip. Such multiple unit strips are well known in the art.

Block 2 represents a die attach step where an electronic device or semiconductor die is bonded to a leadframe. Typically, leadframes comprise a die bond pad and have a plurality of leads or connective portions either coupled to or in proximity to the die bond pad. Leadframes typically comprise copper, a copper alloy, an iron/nickel alloy (e.g., Alloy 42), or the like. The semiconductor die is attached to the die bond pad using well known techniques.

Block 4 represents a wire bond step where conductive wires are attached or bonded at one end to wire bond pads on the semiconductor die and to particular leads at the opposite end. After wire bonding, the semiconductor die, the wire bonds, and a portion of each lead are encapsulated with, for example, an epoxy molding compound as represented by block 6. With only a portion of each lead encapsulated, the remaining portion of each lead is exposed (i.e., after encapsulation, a plurality of exposed leads are provided). Techniques and materials for wire bonding and encapsulating are well known in the art.

After encapsulation, the semiconductor devices are marked, typically with an ink, and subjected to a curing process to cure the molding compound and the ink. This is represented by blocks 8 and 10. In block 12, the semiconductor devices are then placed in an electroplating bath and the leads are electroplated with a solderable metal (e.g., lead/tin, indium/tin, antimony/tin, lead/indium, or the like) using well known techniques. When the solderable metal comprises two or more metals, the two or more metals are either electroplated individually in separate plating baths or are plated from an anode comprising an alloy of the two or more metals.

According to the present invention, after electroplating and before final assembly (i.e., before the electroplated leads are attached or soldered to a next level of assembly), the electroplated leads are heated or exposed to an elevated temperature that is sufficient to flow or melt the solderable metal. By exposing the electroplated leads to such a temperature, the adhesion between the solderable metal and the underlying leads is significantly improved. In addition, any extraneous plating (i.e., non-uniform coverage, localized thick areas, or nodules) is eliminated because the extraneous plating flows into the overall deposit.

Preferably, the heating step is done immediately following the electroplating process as represented by block 14. This is preferred because the improved adhesion positively impacts the trim and form step (block 16), the electrical testing step (block 18), and the packaging step (block 20). During the trim and form step, the electroplated leads are severed or trimmed from the leadframe strip to a desired length and bent or formed to a desired shape. This process separates the multiple unit strips into individual semiconductor devices. In those devices that do not require lead forming, the heat treatment step preferably is done before the leads are trimmed or severed from the leadframe strip.

Without the heat treatment step of block 14, portions of the solderable metal tend to delaminate or peel away from the underlying leads during the trim and form step. The delaminated solderable metal requires manufacturers to shut down equipment in order to clean it. This down-time negatively impacts throughput thereby increasing manufacturing costs. By heating the solderable metal prior to the trim and form step (block 16) according to the present invention, down-time at this step is greatly reduced.

During the electrical testing step of block 18, the semiconductor devices are tested according to specific electrical parameters. Without the heat treatment step of block 14, the delaminated solderable metal and/or excess plating can form bridges between adjacent leads thereby resulting in shorting problems. Also, the delaminated solderable metal obstructs or clogs test fixtures thereby causing down-time for cleaning. In addition, production personnel have to manually scrub the delaminating metal from the leads in order to make good contact to the test fixture, which negatively impacts throughput and reliability. With the heat treatment step of block 14, test yields are increased because bridging problems are reduced. Also, the heat treatment step enhances equipment up-time and throughput thereby reducing manufacturing costs.

During the packaging step of block 20, the individual semiconductor devices are loaded into packaging means for storing and protecting the semiconductor devices until they are used in a final or next level of assembly. A tape and reel apparatus is an example of a device used to package the semiconductor devices. Without the heat treatment step (block 14), the solderable metal further delaminates during the tape and reel step. This further delamination can result in bridging between adjacent leads and ultimately cause electrical shorts after final assembly. Also, it requires manufacturers to use a visual inspection step to catch any delamination problems, which adds process cycle time and costs. With the heat treatment step (block 14), further delamination at the packaging step is greatly reduced thereby reducing electrical shorting problems and visual inspection requirements.

Block 22 represents a final assembly step where the electroplated leads are attached or soldered to a next level of assembly. For example, the electroplated leads are metallurgically attached or soldered to metal bond pads located on a surface of a printed circuit board. In the prior art, this is the first time the solderable metal is heated to a temperature sufficient to flow the solderable metal. But as is readily apparent based on the above description, this is too late in the process flow to resolve the aforementioned problems that occur before the final assembly step.

FIG. 2 illustrates an isometric view of a preferred apparatus for use with the method according to the present invention. Apparatus 30 includes an upper heated gas tube 31 and a lower heated gas tube 32. Upper heated gas tube 31 and lower heated gas tube 32 each include an outer shell 33 and 34 respectively, a heating element 36 and 37 respectively, an inlet 38 and 39 respectively for introducing a carrier gas to be heated, and a plurality of holes 41 and 42 respectively for focusing the heated carrier gas (represented by arrows 44 and 46) onto an electronic or semiconductor device 47.

Heating elements 36 and 37 typically are resistive type heating elements and are coupled to an adjustable power supply (not shown). The adjustable power supply selected depends upon the desired temperature in which the carrier gas is to be heated. A carrier gas supply (not shown) is coupled to inlets 38 and 39. Preferably, a nitrogen carrier gas or the like is used. Heated gas tubes 31 and 32 are commercially available devices and can be obtained from Sylvania Corp.

Semiconductor device 47 is shown integrally part of an electroplated leadframe strip 48. Semiconductor device 47 further includes electroplated leads or connective portions 49 and an encapsulated portion 51 that covers or contains an electronic or semiconductor device and conductive connective means (e.g., wire bonds). Electroplated leadframe strip 48 includes a base metal 52 and an electroplated solderable metal 53 (this is more clearly shown in FIG. 3). Electroplated leads 49 also comprise base metal 52 and electroplated solderable metal 53. For example, base metal 52 comprises copper, a copper alloy, a nickel/iron alloy (e.g., Alloy 42), or the like and electroplated solderable metal 53 comprises a Sn/Pb alloy or the like.

FIG. 3 illustrates an enlarged cross-sectional view of the apparatus shown in FIG. 2 taken along reference line 3—3. Preferably, both upper heated gas tube 31 and lower heated gas tube 32 are placed a distance 54 and 56 respectively in a range from about 1.5 millimeters (mm) to about 3.0 mm from electroplated leadframe strip 48.

To flow or melt electroplated solderable metal 53, electroplated leadframe strip 48 including semiconductor device 47 is passed between (e.g., as represented by arrow 57 in FIGS. 2 and 3) upper heated gas tube 31 and lower heated gas tube 32. Preferably, when electroplated solderable metal 53 comprises an 80% Sn–20% Pb alloy, a carrier gas (e.g., nitrogen) is heated in heated gas tubes 31 and 32 such that the carrier gas has a temperature in a range from about 185° C. to about 220° C. when it reaches electroplated leads 49. A carrier gas pressure of about 5000 kilograms/square meter (about 7 to 8 pounds/square inch) at the carrier gas source is sufficient. The temperature of the carrier gas necessary to flow or melt solderable metal 53 is determined, for example, knowing the composition of the solderable metal and using widely available phase diagram information.

Electroplated leadframe strip 48 typically is passed between heated gas tubes 31 and 32 at a rate of about 50 mm/second when electroplated solderable metal 53 comprises an 80% Sn–20% Pb alloy that is about 4 microns to about 8 microns thick. This rate is adjusted up or down depending upon the type of solderable metal used, its thickness, and its grain structure. Additional sets of upper and lower heated gas tubes may be added to provide an additional heat source for flowing or melting electroplated solderable metal 53. The temperature of the carrier gas from one set of heated gas tubes may be the same, lower, or higher than the temperature of the carrier gas from the other set or sets of heated gas tubes. Although only one set of holes is shown in heated gas tubes 31 and 32, each heated gas tube may contain additional sets of holes near holes 41 and 42.

When used with an automated electroplating system such as a Technic electroplating system, apparatus 30 is conveniently placed adjacent the final loading apparatus to flow the solderable metal just before the leadframe strips are loaded into a holding magazine. Optionally, a belt furnace or the like is used to flow the electroplated solderable metal. However apparatus 30 is preferred because it is fast and is conveniently integrated at the end of the electroplating process.

By now it should be apparent that a method for use with semiconductor devices having leads that are electroplated with a solderable metal has been provided. By heating the electroplated solderable metal such that the solderable metal flows or melts, significant process and reliability problems are reduced during subsequent operations. This greatly reduces equipment down-time and manufacturing costs and greatly increases manufacturing cycle time. Also, a preferred apparatus for heating the solderable metal has been provided that conveniently integrates into standard electroplating equipment thereby simplifying process integration and making integration cost effective.

We claim:

1. A method for making a semiconductor device having electroplated leads comprising the steps of:

providing a semiconductor device having a plurality of exposed leads, the semiconductor device including an encapsulated semiconductor die;

electroplating the plurality of exposed leads with a solderable metal to form a plurality of electroplated leads; and heating the plurality of electroplated leads to an elevated temperature sufficient to flow the solderable metal to improve the adhesion between the solderable metal and the underlying exposed leads, wherein the step of heating the plurality of electroplated leads is done prior to attaching the semiconductor device to a next level of assembly.

2. The method of claim 1 wherein the step of providing the semiconductor device includes providing a semiconductor device having a plurality of exposed leads comprising a nickel/iron alloy.

3. The method of claim 1 wherein the step of providing the semiconductor device includes providing a semiconductor device having a plurality of exposed leads comprising a copper alloy.

4. The method of claim 1 wherein the step of providing the semiconductor device includes providing a semiconductor device having a plurality of exposed leads comprising copper.

5. The method of claim 1 wherein the step of heating the plurality of electroplated leads includes heating the plurality of electroplated leads with a heated gas tube.

6. The method of claim 1 wherein the step of electroplating the plurality of exposed leads with the solderable metal includes electroplating the plurality exposed leads with a Sn/Pb alloy.

7. The method of claim 6 wherein the step of electroplating the exposed leads with the Sn/Pb alloy includes electroplating the exposed leads with an 80% Sn–20% Pb alloy.

8. The method of claim 7 wherein the step of heating the plurality of electroplated leads includes heating the plurality of electroplated leads to a temperature in range from about 185° C. to about 220° C.

9. A process for forming an electronic device having an electroplated lead including the steps of:

providing the electronic device including an encapsulated device and an exposed metal lead;

electroplating the exposed metal lead with a solderable metal to form an electroplated lead; and heating the electroplated lead at an elevated temperature sufficient to flow at least a portion of the solderable metal to improve the adhesion between the solderable metal and the underlying exposed leads, wherein the heating step occurs prior to metallurgically attaching the electroplated lead to an application substrate and after the electronic device has been encapsulated.

10. The process according to claim 9 wherein the heating step occurs prior to one of trimming and forming the electroplated lead.

11. The process according to claim 9 wherein the heating step occurs prior to electrically testing the electronic device.

12. The process according to claim 9 wherein the heating step is done using heated gas tubes.

13. A method for forming a semiconductor device having electroplated connective portions comprising the steps of:

placing a semiconductor device having a plurality of connective portions into an electroplating bath, wherein the plurality of connective portions comprise a first metal, and wherein the Semiconductor device includes an encapsulated semiconductor die;

electroplating a solderable metal onto the plurality of connective portions; and exposing the solderable metal to a temperature sufficient to melt the solderable metal to improve the adhesion between the solderable metal and the underlying exposed leads, wherein the solderable metal is melted prior to one of trimming and shaping the plurality of connective portions.

14. The method of claim 13 wherein the step exposing the solderable metal to the temperature to melt the solderable metal includes heating the solderable metal with heated gas means.

* * * * *